United States Patent

Van De Ven

[11] Patent Number: 5,880,849
[45] Date of Patent: Mar. 9, 1999

[54] COMPONENT PLACEMENT MACHINE AND METHOD OF PLACING A COMPONENT ON A CARRIER BY MEANS OF SAID COMPONENT PLACEMENT MACHINE

[75] Inventor: Johannes T.A. Van De Ven, Eindhoven, Netherlands

[73] Assignee: U.S. Philips Corporation, New York, N.Y.

[21] Appl. No.: 759,664

[22] Filed: Dec. 6, 1996

[30] Foreign Application Priority Data

Dec. 14, 1995 [EP] European Pat. Off. .............. 95203481

[51] Int. Cl.$^6$ ................................... G01B 11/00
[52] U.S. Cl. ........................ 356/399; 356/400; 356/401
[58] Field of Search .................................. 356/399, 400, 356/401; 29/720, 740

[56] References Cited

U.S. PATENT DOCUMENTS

| | | | |
|---|---|---|---|
| 4,797,994 | 1/1989 | Michano et al. ........................ | 29/720 |
| 5,084,959 | 2/1992 | Ando et al. ............................... | 29/740 |
| 5,216,804 | 6/1993 | Rosier et al. ............................. | 29/834 |
| 5,278,634 | 1/1994 | Skunes et al. ........................... | 356/400 |

OTHER PUBLICATIONS

"Fast Component Mounter", from Philips Electronic Manufacturing Technology, Jul. 1995.

*Primary Examiner*—Robert Kim
*Attorney, Agent, or Firm*—Anne E. Barschall

[57] ABSTRACT

The invention relates to a component placement machine with a frame (21), a robot (26), a transport system (22) for transporting carriers (23), a placement head (28) for placing components which is fastened to an arm (27) of the robot, a component imaging device (30) also fastened to the arm of the robot, and an imaging device (32) for a carrier. According to the invention, the imaging device (32) for the carrier is fastened to the same arm (27) on which also the imaging device (30) for the component and the placement head (28) are present, in order to increase the placement accuracy.

10 Claims, 3 Drawing Sheets

COMPONENT PLACEMENT MACHINE AND METHOD OF PLACING A COMPONENT ON A CARRIER BY MEANS OF SAID COMPONENT PLACEMENT MACHINE

The invention relates to a component placement machine with a frame, a robot, a transport system for transporting carriers, a placement head for placing components on a carrier, which placement head is fastened to an arm of the robot, a component imaging device also fastened to said arm of the robot, and an imaging device for detecting marks of a carrier.

The component placement machine described above has been manufactured for a number of years by the Philips company under the type designation FCM (Fast Component Mounter) and is described inter alia in the brochure "FAST COMPONENT MOUNTER" from Philips Electronic Manufacturing Technology, date of issue July 1995. FIG. 1 thereof diagrammatically shows part of this type of placement machine. The reference numeral 1 relates to a broken line indicating the machine frame. On the frame 1 there is a transport system of which only the transport rails 2 are indicated, for the transport of printed circuit boards 3. Above the transport rails there is a component placement unit 4 formed by a U-shaped frame 5 to which an X-Y robot 6 is fastened. The X-Y movement of the robot 6 is indicated with arrows. A placement head 8 with which components can be placed on the carrier is fastened to an arm 7 of the robot. A component imaging device 9 is also fastened to the arm 7. The exact position of a component picked up by the placement head can be determined thereby, so that corrections for an exact placement of the component can be carried out. Data processing takes place in an image processor 10 of the placement unit. The placement machine is further provided with a so-called "Board Vision Module" formed by a second X-Y robot 11 on which an imaging device 12 for a carrier is fastened. This imaging device 12 serves to determine the exact location on the carrier where the component must be placed. The data are passed on to an image processor 13 in which corrections can be carried out. Very stringent requirements are imposed on the accuracy and reproducibility of the carrier transport and of the carrier itself in such machines. An additional accuracy loss for the imaging device 12 of the carrier is caused by the robot 11.

It is an object of the invention to provide a component placement machine which has a high component placement accuracy.

The invention is for this purpose characterized in that the imaging device for the carrier is fastened to said arm of the robot. Since the two imaging devices are now fastened to the same arm of the robot, there is a fixed relationship between the measuring system for the component and that for the carrier, because the imaging devices have a defined position relative to one another and are no longer dependent on moving parts. The calibration of the placement head against the measuring systems has become much simpler because no interface is necessary anymore. Deviations caused by thermal effects are much smaller. The above leads to a greater component placement accuracy. In addition, it is possible now to build the placement machine in a more compact and inexpensive manner because a separate robot for the imaging device for the carrier is no longer necessary. Furthermore, the data from both imaging devices can now be sent to the image processor via a single coax cable.

Preferably, the component imaging device is a laser alignment system. Such a system is highly suitable for the placement of small components (SMDs). A laser alignment system is of a compact construction so that a good integration with an imaging device for the carrier is possible. The operation of a laser alignment system is described, for example, in U.S. Pat. No. 5,278,634.

The use of a laser alignment sensor system, however, leads to the problem that no image can be taken of deviant or odd components because the dimensions or shape of such components are not suitable for this. This problem is solved by a further embodiment of the invention which is characterized in that the machine is provided with an optical deflection system for taking an image of an odd component by means of the imaging device for the carrier.

The invention also relates to a method of placing a component on a carrier, by which method the carrier is subjected to an optical detection by means of an imaging device fixedly connected to a placement head and designed for determining the position where the component is to be placed on the carrier, and by which method the component is also subjected to an optical detection for determining the position of the component after the latter has been picked up by the placement head. Such a method is known from U.S. Pat. No. 5,084,959. To increase the component placement accuracy, the method is characterized in that the detection of the component is effected by means of an imaging device which is fixedly connected to the placement head.

The invention will now be explained in more detail with reference to an embodiment shown in the drawings, in which FIG. 1 shows a prior art machine.

Figure 1:
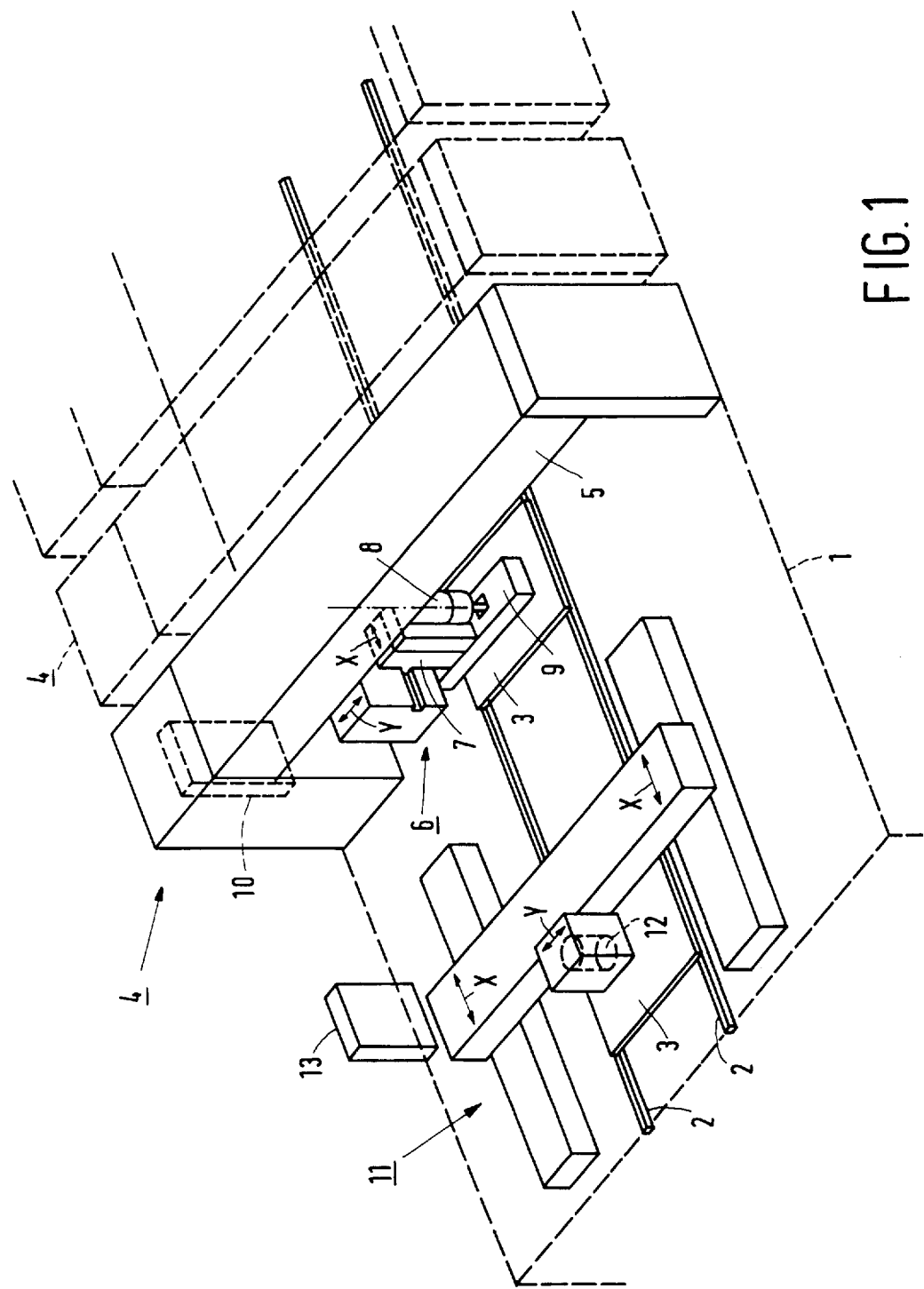
Figure 2:
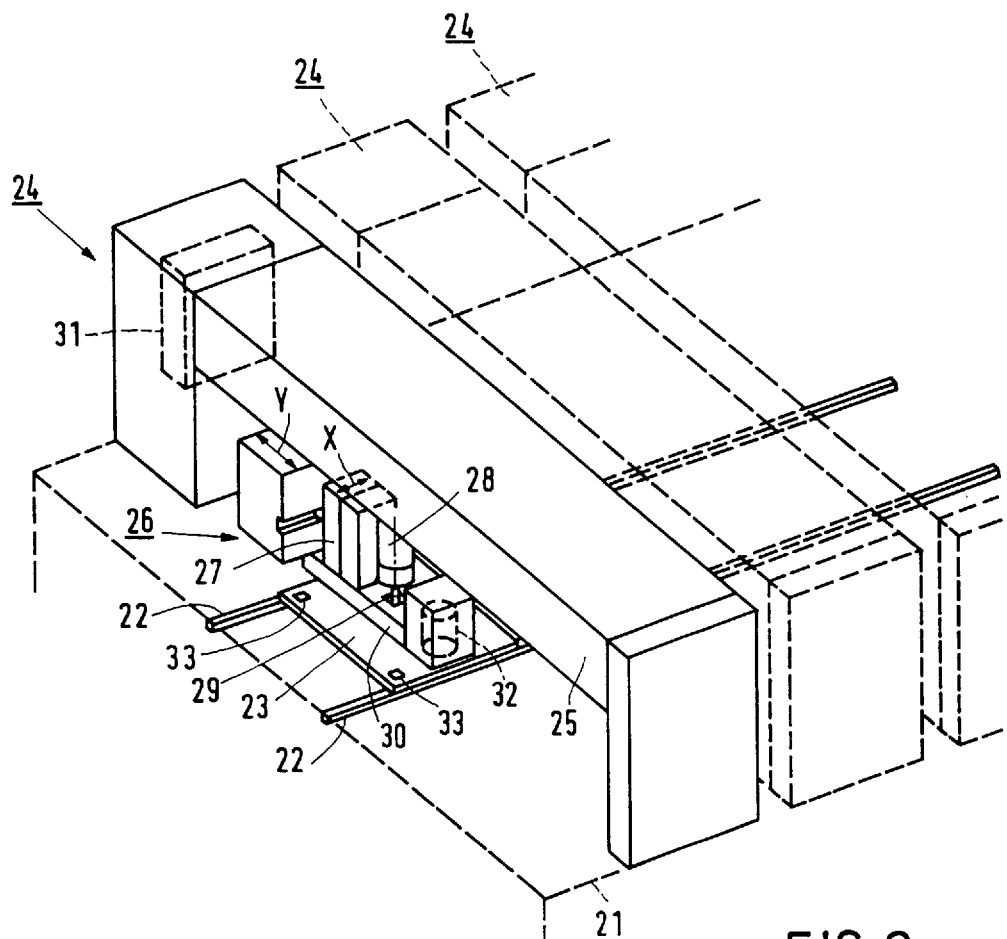
FIG. 2 is a placement machine according to the invention.

A transport system for the transport of carriers, for example printed circuit boards 23, is present on a frame 21 of a placement machine, of which system only the transport rails 22 are indicated. Above the transport rails there is a component placement unit 24 formed by a U-shaped frame 25 to which an X-Y robot 26 is fastened. The X-Y movement of the robot 26 is indicated with arrows. A placement head 28 is fastened to an arm 27 of the robot. The placement head has a suction nozzle 29 with which components can be picked up from a feeder and placed on the carrier. A component imaging device 30 is also fastened to the arm 27. During transport of a component to its desired position on the carrier, the component is brought into the image field of the imaging device 30, whereupon the component position in the X, Y and $\phi$ directions ($\phi$=rotational position about Z-axis) is determined. The data are passed on to an image processor 31 where they are compared with data corresponding to an image model stored in the processor. Any deviations are calculated and these deviations are taken into account during placement of the component on the carrier. All this takes place from the moment of picking-up of a component up to the moment of placing the component on the carrier, the so-called in-flight check of components. A laser alignment device is preferably used as the imaging device. Such a device can be of compact construction and is very suitable for taking images of small components (SMDs). The placement machine may be provided with a number of placement units 24 for placing several components, as indicated with broken lines. Each placement unit then has its X-Y robot, a placement head, an imaging device, and an image processor. An r,$\phi$ robot may be used instead of an X-Y robot.

According to the invention, an imaging device 32 for the carrier is placed on the arm 27 of the robot 26. It is necessary for an exact placement of a component on the carrier that also the exact position of the location where the component is to be placed is known. This is achieved in that an image is taken of certain marks (fiducials) 33 present on the carrier. The relative position where the component must be on the carrier with respect to the marks is known in advance. The data on the image taken of the position of the marks are passed on to an image processor 31 where they are compared with data stored in the processor, and deviations are calculated. These data in conjunction with the data on the component position now render it possible to move the placement head accurately to its desired position on the carrier. Since the placement head and the two imaging devices are placed on the same arm, the interrelationships between these components are unequivocally defined, so that a very high accuracy is obtained.

Figure 3:
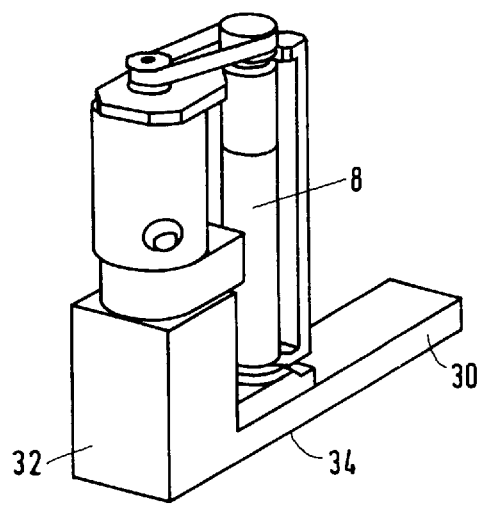
FIG. 3 is an integral unit of placement head and both imaging devices.

As FIG. 3 shows, the placement head 8 and the two imaging devices 30, 32 form a compact unit. The imaging devices are accommodated in one housing part 34. The unit may be manufactured fully separately from the other machine components, tested, and subsequently mounted to an arm of the robot.

Figure 4:
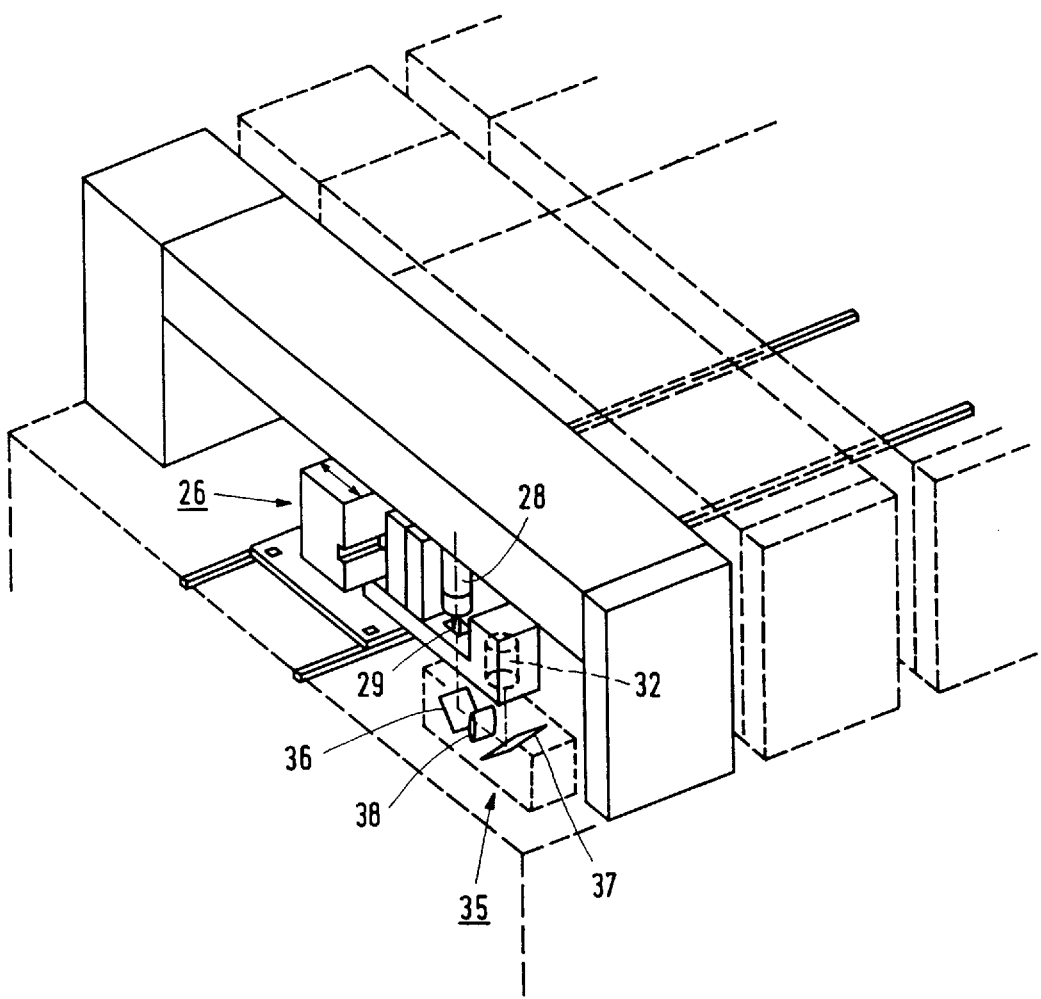
FIG. 4 is a placement machine as shown in FIG. 2, but additionally provided with a system of lenses for detecting odd components.

FIG. 4 in addition shows an optical deflection system 35 in the placement machine. This system may comprise, for example, two mirrors 36, 37 with a lens in between. In FIG. 4, the system is fixedly connected to the machine frame and serves to take an image of an odd component by means of the imaging device 32 for the carrier. It is usually not possible to take an image of an odd component by means of a laser alignment system. The robot 26 with the placement and detection unit is mounted in a position above the optical system 35 such that an image of the component held by the suction nozzle 29 can be taken by the imaging device 32 via the optical system. Such an optical system may alternatively be connected to the robot, in which case the system must be displaceable relative to the robot in order to facilitate the other measurements. The mirrors may be formed, for example, by two reflecting surfaces of a prism. The lens 38 serves to adapt the image field and to set the focal distance correctly.

I claim:

1. A component placement machine with a frame, a robot, a transport system for transporting carriers, a placement head for placing components on a carrier, which placement head is fastened to an arm of the robot, a component imaging device also fastened to said arm of the robot, and an imaging device for detecting marks of a carrier, characterized in that the imaging device for the carrier is fastened to said arm of the robot.

2. A component placement machine as claimed in claim 1, characterized in that the component imaging device comprises a laser alignment system.

3. A component placement as claimed in claim 2, characterized in that the machine is provided with an optical deflection system for taking an image of an odd component by means of the imaging device for the carrier.

4. The machine of claim 1 wherein the component imaging device and the imaging device of the carrier have a known relative position, which known relative position is not dependent on any moving parts.

5. The machine of claim 4 further comprising an image processor arranged to calculate a deviation from stored data for image data received from the component imaging device and for the imaging device for the carrier, based on the known relative position.

6. The machine of claim 1 wherein output signals from the component imaging device and the imaging device for the carrier are transmitted from the imaging devices for processing via a single coaxial cable.

7. A method of placing a component comprising:

transporting the component using a placement head attached to a robot arm;

during said transporting, optically detecting a carrier onto which the component is to be placed, the detecting being via a first imaging device attached to the robot arm;

during said transporting, optically detecting the component using a second imaging device attached to the robot arm.

8. The method of claim 7 wherein the second imaging device has a known relative position with respect to the first imaging device, which known relative position is not dependent on any moving parts; and the method further comprises the step of, during said transporting, comparing output signals from said first and second imaging devices with stored data and calculating a deviation based on the known relative position.

9. A placement and detection unit for use in a component placement machine, the unit comprising a robot arm;

a placement head attached to the robot arm;

a component imaging device attached to the robot arm;

a carrier imaging device attached to the robot arm.

10. The unit of claim 9 wherein the carrier imaging device has a known relative position with respect to the component imaging device, which known relative position is not dependent on any moving parts.

* * * * *